United States Patent [19]

Netzer

[11] Patent Number: 5,763,781
[45] Date of Patent: Jun. 9, 1998

[54] COUPLED RESONATOR VIBRATORY RATE SENSOR

[76] Inventor: Yishay Netzer, 112, Yuvalim 20142, Israel

[21] Appl. No.: 718,434

[22] PCT Filed: Feb. 8, 1996

[86] PCT No.: PCT/US96/01716

§ 371 Date: Sep. 30, 1996

§ 102(e) Date: Sep. 30, 1996

[87] PCT Pub. No.: WO96/26445

PCT Pub. Date: Aug. 26, 1996

[30] Foreign Application Priority Data

Feb. 23, 1995 [IL] Israel ......... 112770

[51] Int. Cl.$^6$ ......... G01P 9/04
[52] U.S. Cl. ......... 73/504.16
[58] Field of Search ......... 73/504.16, 504.12, 73/504.14, 504.15, 504.02, 504.03, 504.04, 862.59; 310/370, 321

[56] References Cited

U.S. PATENT DOCUMENTS

| | | |
|---|---|---|
| 4,654,663 | 3/1987 | Alsenz et al. . |
| 4,930,351 | 6/1990 | Macy et al. ......... 73/504.04 |
| 4,958,519 | 9/1990 | Whaley . |
| 5,056,366 | 10/1991 | Fersht et al. . |
| 5,166,571 | 11/1992 | Konno et al. ......... 73/504.16 |
| 5,349,855 | 9/1994 | Bernstein ......... 73/504.16 |
| 5,367,217 | 11/1994 | Norling . |
| 5,600,065 | 2/1997 | Kar ......... 73/504.12 |

*Primary Examiner*—Christine K. Oda
*Attorney, Agent, or Firm*—Mark M. Friedman

[57] ABSTRACT

An inertial angular rate sensor (IARS) which includes a symmetrical mechanical resonator. The rate sensor includes one or more one pair of vibrating masses. The sensor further incudes a mechanical coupler which forces the masses to move in a symmetrical manner despite mechanical tolerances.

11 Claims, 5 Drawing Sheets

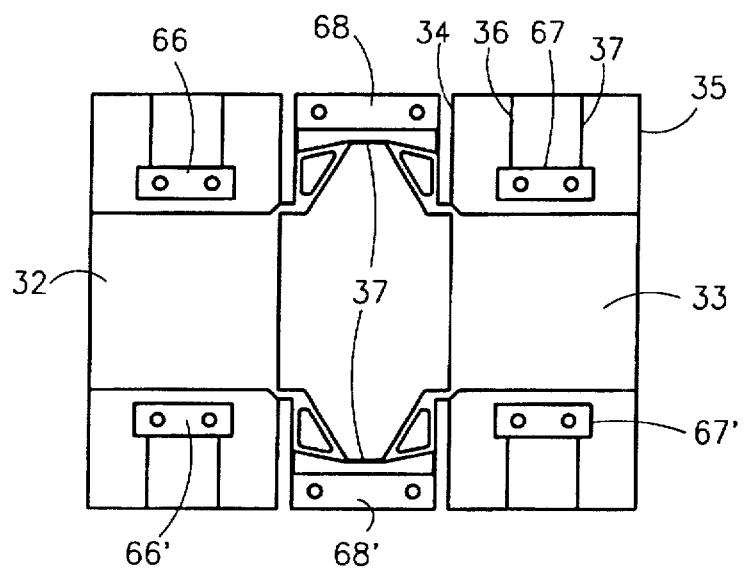
FIG. 8
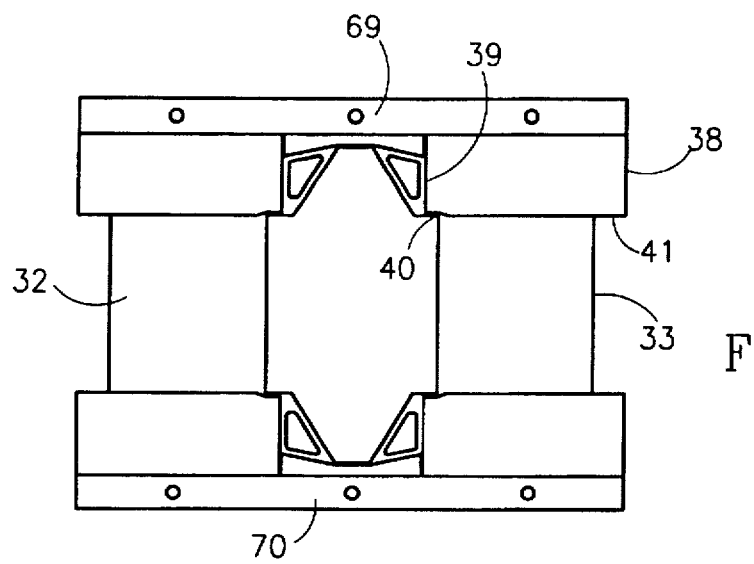
FIG. 9
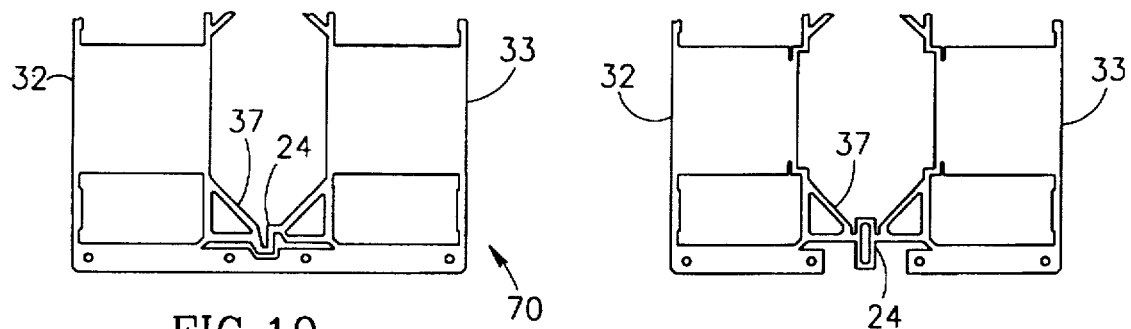
FIG. 10
FIG. 11

COUPLED RESONATOR VIBRATORY RATE SENSOR

FIELD OF THE INVENTION

This invention relates to symmetrical mechanical resonators and in particular to vibratory or Coriolis type rate sensors employing the same.

BACKGROUND OF THE INVENTION

The terms "tuning forks" and "symmetrical mechanical resonators" are used herein as synonyms and both can be defined as signifying mechanical structures that include two masses that are counter-oscillating in such a manner that their common center-of-mass is ideally stationary and their total linear and angular momentums are zero at any time. The classical tuning fork includes two tines connected to a common stem, which in turn is connected to a stationary base. The purpose of the stem is to decouple the tines as much as possible from the base and to couple them to each other, so that they have a common resonance frequency and a minimum energy is dissipated to the stationary base.

Tuning forks have been used as frequency standards by employing piezoelectric crystalline quartz. They have also been used as angular inertial rate sensors, wherein the excited vibrational counter-motion of the tines combines with the inertial rotation of the tuning-fork base to induce in the tines so-called Coriolis accelerations which are perpendicular to the plane of the excited vibrations and of opposite sense in each of the two tines. These accelerations induce vibratory motions in the tines perpendicular to the excited vibrations, the difference of which is indicative of the input angular inertial rate. Although each of the tines responds to said inertial rotation, it also responds to vibratory motion of the mounting base that would lead to an output error that is indistinguishable from the rate signal; however, by processing the differential induced vibrations, the error is ideally eliminated. The earliest application of a tuning fork resonant structure for angular inertial rate sensing is described in "New space rate sensing instrument," by J. Lyman in Aeronautical engineering review, Vol. 12, pp. 24–30, 1953. A modified rate sensor that utilizes a double tuning fork is described in "Reduction of errors in vibratory Gyroscopes by Double Modulation" by R. W. Bush and G. C. Newton, Jr. in IEEE Transactions on automatic control, October 1964 pp. 525–535. Numerous other rate sensors are based on vibrating structures that are essentially constituted by two counter-oscillating masses of various structures. In order to decrease the cost of vibratory rate sensors, they are often manufactured as monolithic structures by employing photolithographic microfabrication techniques. All monolithic tuning fork geometries utilized in the prior art belong to either of the following three families:

Single tuning-fork, as in U.S. Pat. No. 5,343,749.

H-shaped structures that are essentially two tuning forks with a common base, as in U.S. Pat. Nos. 4,524,619 and 5,056,366.

Vibrating frame constructions that can be regarded as two tuning-forks with the ends of the ends of their corresponding tines connected, as in U.S. Pat. Nos. 4,654,663 and 5,349,855.

It is obvious to those skilled in the art that there are four main vibration modes in the conventional tuning fork, these being:

1. An in-plane, symmetrical, vibration mode depicted with short arrows in FIG. 1.

2. An asymmetrical, in-plane vibration mode depicted with long arrows in FIG. 1.

3. A symmetrical vibration mode perpendicular to the plane of the tuning fork.

4. An asymmetrical vibration mode perpendicular to the plane of the tuning fork.

The first and third modes are referred to as the excitation mode and the output or Coriolis mode, and are the only modes relevant to rate sensing. The second and fourth modes are parasitic and lead to sensitivities of the rate sensor to linear accelerations. It is well known, however, to those skilled in the art that, regardless of the specific geometry of the tuning fork, there are additional, higher order, vibration modes, that are, however, of little consequence to its applications as a rate sensor.

A shortcoming of all prior art implementations of the tuning fork resonators is that excitation of the first mode may be accompanied by an undesirable excitation of the second mode due to asymmetry in the excitation forces applied to the two tines or due to asymmetry in the mass or stiffness of the tines as a result of manufacturing tolerances. This results in vibrational energy that is transferred to the mounting base through the stem and may lead to output errors in rate sensors of this type. It may also combine with linear oscillations to further deteriorate the fidelity of the output signal.

It is an object of the present invention to provide an improved tuning fork and other symmetrical resonator topologies that is relatively insensitive to mechanical asymmetries, suitable for inertial rate sensors.

It is another object of the invention to provide other improved symmetrical resonator structures that are relatively insensitive to mechanical asymmetries.

It is a further object of the invention to provide such resonator structures that are more complex and include more than two moving masses.

It is a still further object of the invention to provide a symmetrical resonator wherein the second excitation mode is essentially eliminated by mechanically constraining the two oscillating masses to move in opposite directions.

It is a still further object of the invention to provide tuning fork mechanisms wherein the excitation of a pair of tines is effected indirectly by applying force to a single point.

It is a still further object of the invention to provide an improved single-axis rate sensor.

It is a still further object of the invention is to provide a 2-axis rate sensor.

Further objects and advantages of the invention will become apparent as the description proceeds.

SUMMARY OF THE INVENTION

According to the invention, a symmetrical mechanical resonator is provided, which comprises at least one pair of vibrating masses and includes one or more mechanical coupling means that force the masses to move in a symmetrical manner despite mechanical tolerances.

The said mechanical resonator may be, in particular, a tuning fork resonator, a frame-type resonator, or any planar resonator.

According to a preferred embodiment of the invention, the said symmetrical mechanical resonator, comprising the said mechanical coupling means, also comprises means for indirectly exciting said movable masses by applying at least one force that acts on said mechanical coupling means.

In a further embodiment, a planar symmetrical mechanical resonator is provided wherein said force is applied by parametrically modulating the effective length of a mechanical member.

According to a further embodiment of the invention, a single axis inertial angular rate sensor is provided, comprises a mechanical resonator having one or more of the aforesaid characteristics.

A still further embodiment of the invention is a planar mechanical resonator comprising four arms assembled in a cruciform shape, each pair of adjacent arms being connected by mechanical coupling means that force the masses to move in a symmetrical manner, whereby said arms are vibrated in a scissors mode. Preferably said arms are indirectly excited by forces applied in the plane of the resonator along at least one of its axes of symmetry, which forces are more preferably generated by parametrically modulating the effective length of a mechanical member. A resonator according to this embodiment may be comprised in a dual axis inertial angular rate sensor.

BRIEF DESCRIPTION OF THE DRAWINGS

FIG. 8 illustrates a frame-type symmetrical resonator according to the present invention.

FIG. 9 illustrates another frame-type symmetrical resonator according to the present invention.

FIG. 10 shows a modified flexible element employed in the gyro geometry of FIG. 9.

FIG. 11 shows a flexible element as in FIG. 10 but including two flexible elements.

DETAILED DESCRIPTION OF PREFERRED EMBODIMENTS

Figures 1, 2:
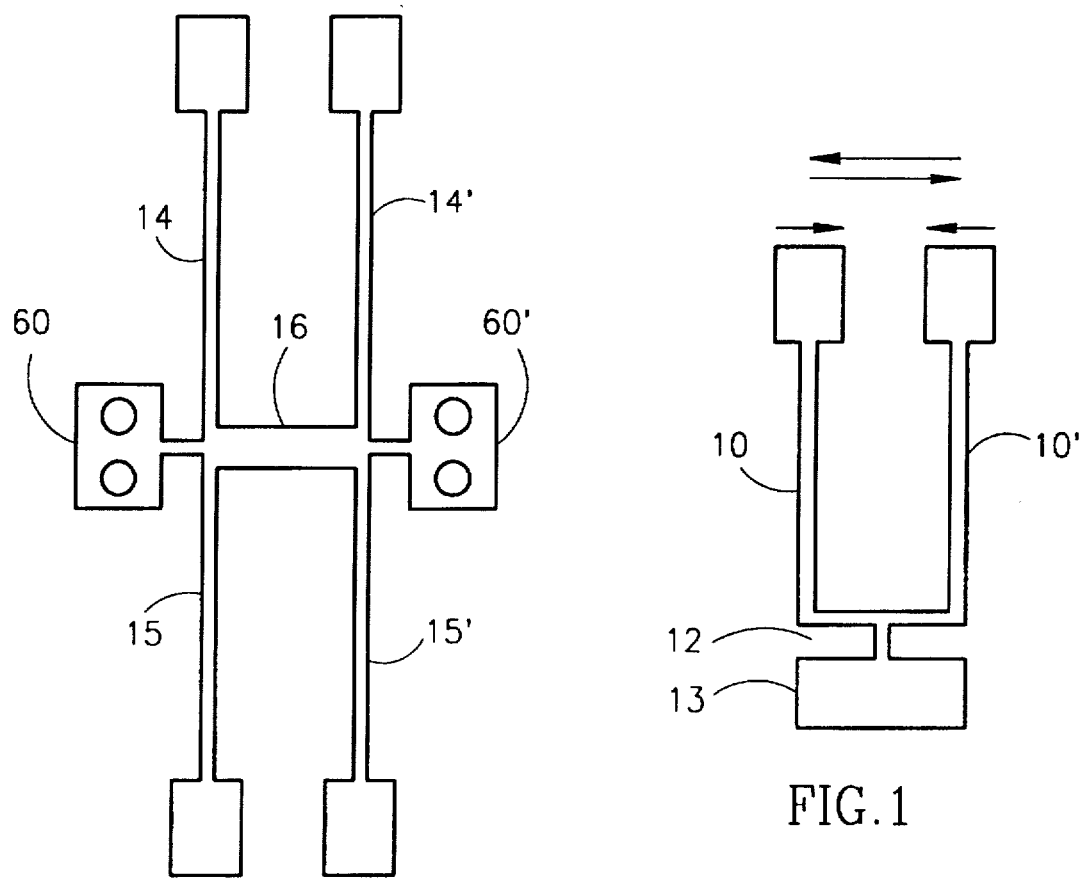
FIG. 1 illustrates a prior art tuning fork.
FIG. 2 illustrates an H-type conventional tuning fork.

FIG. 1 illustrates a conventional, prior art, tuning fork mechanism including tines 10 and 10', stem 12 and mounting base 13. The first symmetrical vibrational mode is indicated by short arrows, the second asymmetrical mode is indicated by long arrows. Stem 12 is optional and the tines may be directly connected to the mounting base.

FIG. 2 illustrates a two-ended conventional tuning fork, as described in U.S. Pat. No. 4,524,619, which includes tines 14 and 14' at one end and tines 15 and 15' at the other end and is provided with mounting bases 60, 60'. A mounting structure 16 is common to all the tines.

Figure 3:
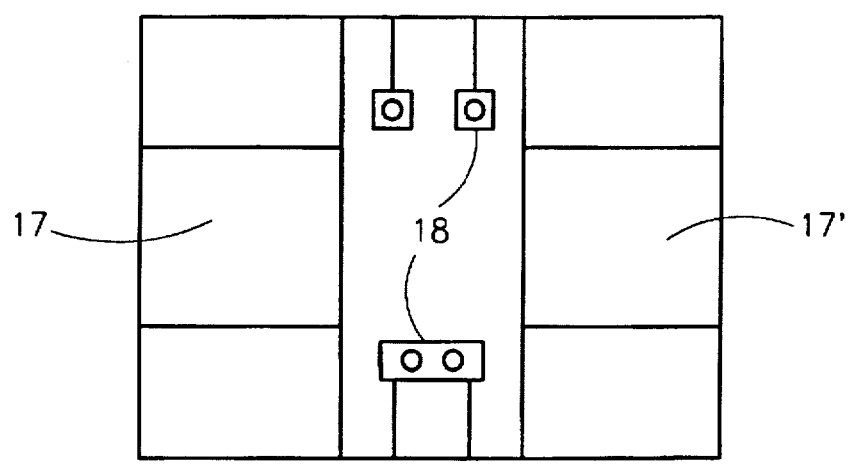
FIG. 3 illustrates a conventional frame-type symmetrical resonator.

FIG. 3 illustrates a frame type, double-tuning fork resonator, including counter moving masses 17 and 17', that are supported by a flexible beam structure that is anchored by mounting bases 18.

All of the above resonator based rate sensors have a left-right symmetry, and are typically excited by applying electrostatic or piezoelectrically generated symmetrical opposing forces on the tines or masses, in order to ideally obtain symmetrical motion. This symmetry is important in order to minimize coupling of vibrational energy to the mounting base by unbalanced reaction forces. Also, the tines static deflection in the presence of external accelerations may combine with the asymmetrical vibrational mode to cause sensitivity of the Coriolis output to acceleration or gravity. In practice, the motion of the tines is never symmetrical, because, due to mechanical tolerances, the tines have different natural resonance frequencies, but since they are excited at a common natural frequency, they do not react symmetrically, i.e., they react with different amplitudes and different phases. The stiffer the stem, the more sensitive is the differential motion to the mechanical tolerances; however, decreasing the stiffness of the stem lowers the frequency of the asymmetrical mode and increases the sensitivity of the structure to external accelerations. The above phenomena may be aggravated by asymmetrical excitation forces on the tines due, for example, to tolerances in the excitation electrodes deposited on the tines that also tends to excite the asymmetrical mode.

A description of the excitation of the asymmetric mode due to asymmetries in a frame-type resonator rate sensor is described in the article: "A Micro machined Comb-Drive Tuning fork Rate Gyroscope" by M. Weinberg et al. which appeared in the Proceedings of the 49th Annual Meeting of the Institute of Navigation, Jun. 21–23, 1993 page 599.

Figure 4:
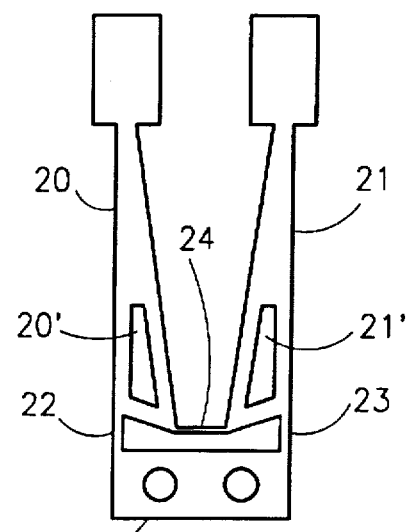
FIG. 4 illustrates a tuning fork according to the present invention.

The purpose of the present invention is to provide symmetrical resonators for inertial angular rate sensors where the excited motion is essentially symmetrical in spite of asymmetries in the structure and the excitation forces. FIG. 4 illustrates a tuning fork according to the present invention. The tuning fork includes tines 20 and 21, a mounting base 61, flexible links 22 and 23, and a flexible mechanical coupling 24 between the two tines. The purpose of the coupling is to force the two tines to move as a mirror image of each other and thus to essentially eliminate the asymmetrical mode. The bases of the two tines have portions 20' and 21' which have apertures for the purpose of reducing weight. Similar apertures portions will be found in the following embodiments as well.

Figure 5:
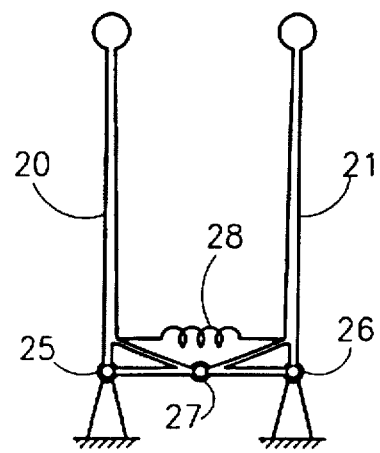
FIG. 5 illustrates an idealized equivalent of a tuning fork according to the present invention.

The operation of the coupling in FIG. 4 is easier to understand with the aid of FIG. 5, where an idealized equivalent of the tuning fork of the present invention is illustrated. The two tines 20 and 21 are stiff and are mounted on pivots 25 and 26 that represent the flexible links 22 and 23. They are also coupled by means of a third pivot 27 that forces their motion to be symmetrically equal. The spring 28 represent the equivalent spring rate of all the flexible 22, 23, 24 links in FIG. 4. It is obvious that, regardless of the symmetry of the forces applied to the tines or their dimensional symmetry, their motion will be essentially symmetrical.

Figure 6:
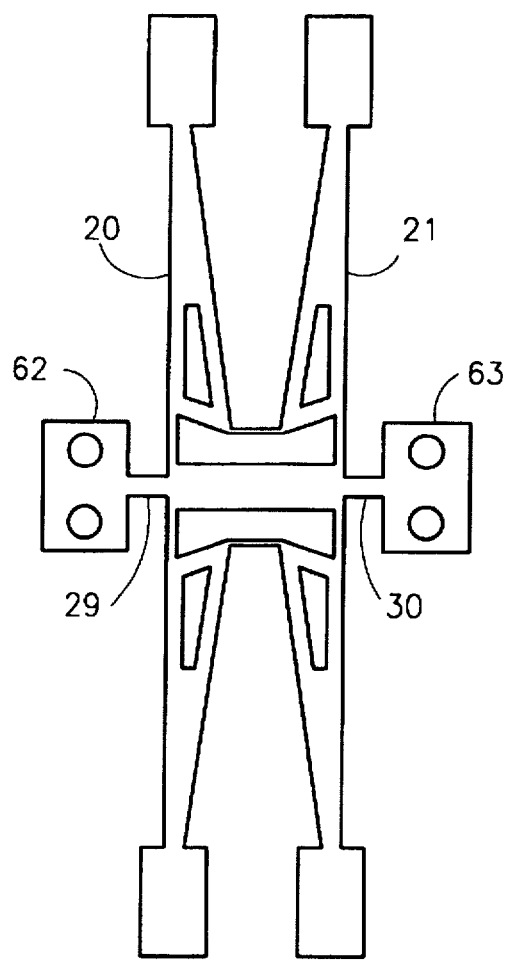
FIG. 6 illustrates an H-type tuning fork according to the present invention.

FIG. 6 illustrates an H-type tuning fork according to the present invention. The respective tines are coupled as before and stems 29 and 30 allow torsional motion of the tuning fork around its line of symmetry. 62 and 63 indicate two mounting bases.

Figure 7:
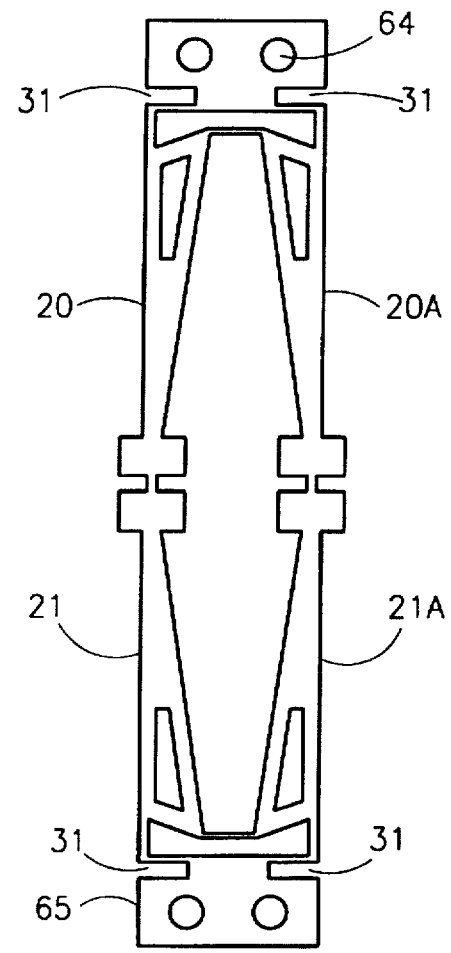
FIG. 7 illustrates a frame-type double tuning fork resonator according to the present invention.

FIG. 7 illustrates a frame-type resonator according to the present invention. The structure is essentially two tuning forks with their respective tines (20–21 and 20a–21a) connected. The notches 31 are provided in order to eliminate excessive tension in the tines when deflected. 64 and 65 indicate two mounting bases.

FIG. 8 illustrates another frame-type resonator according to the present invention, each mechanism comprising bars 34, 35, 36, 37. 66, 66', 67, 67', and 68, 68' indicate mounting bases. The two masses 32 and 33 are supported on either of its sides by parallel-motion bar mechanisms (four altogether) well known to those skilled in the art, and is coupled on either side by mechanical couplings 37 (two altogether), as in FIG. 4, that forces their motion to be the mirror image of each other, as desired.

FIG. 9 illustrates a modified frame-type resonator of FIG. 8 where the two masses are mounted on a simpler bar mechanism comprising bars 38, 39 and tension relief elements 40, 41. 69 and 70 indicate two mounting bases.

The flexible link 24 in FIG. 4 can be modified so that it will be stressed in compression and tension rather than in flexure, and thus further increase the stiffness of the tines to non symmetrical motion, this is achieved by employing a flexible element perpendicular to its original orientation.

In FIG. 10 the modified flexible element is employed in the gyro geometry in FIG. 9—wherein the flexible element comprises a single element. In FIG. 11 the flexible element comprises two flexible elements to restore the symmetrical construction.

Figure 12:
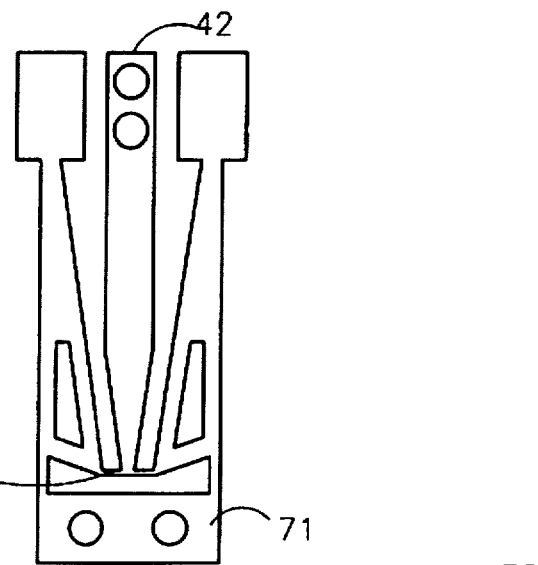
FIG. 12 illustrates a centrally excited tuning fork according to the present invention.

In prior art tuning forks and symmetrical resonators the two masses are excited by two opposing forces individually applied to them, the forces are typically electrostatic magnetic or piezoelectric. FIG. 12 illustrates an excitation method according to the present invention applied to the tuning fork in FIG. 4, wherein the tines are deflected by applying a single force on the mechanical linkage 24 through member 42. 71 indicates a mounting base. A preferred method for the excitation as in FIG. 12 is by piezoelectrically modulating the length of element 42 at the resonant frequency of the tuning fork. An alternative method is by modulating the apparent length of member 42 by applying a force on its center which is perpendicular to the plane of the paper. In this method, referred to as parametric excitation, the excitation frequency should be one half the resonant frequency of the tuning fork. A possible implementation of this method, applicable to micromechanical devices, is by means of electrostatic attraction forces applied to element 42. This may be effected by constituting a capacitor that comprises a first stationary planar electrode set and a second electrode set deposited on a planar surface of element 42, and applying an alternating excitation voltage on the resulting capacitor. Alternatively, the electrode set could be of the comb type described in "A Micro machined Comb-Drive Tuning fork Rate Gyroscope" by M. Weinberg et al. which appeared in the Proceedings of the 49th Annual Meeting of the Institute of Navigation, Jun. 21–23, 1993 page 599, wherein the force is applied in the plan of the sensor.

Another preferable parametric excitation method applicable to piezoelectric crystalline sensor is by deflecting element 42 by means of shear forces generated with a set of electrodes deposited on it.

Figure 13:
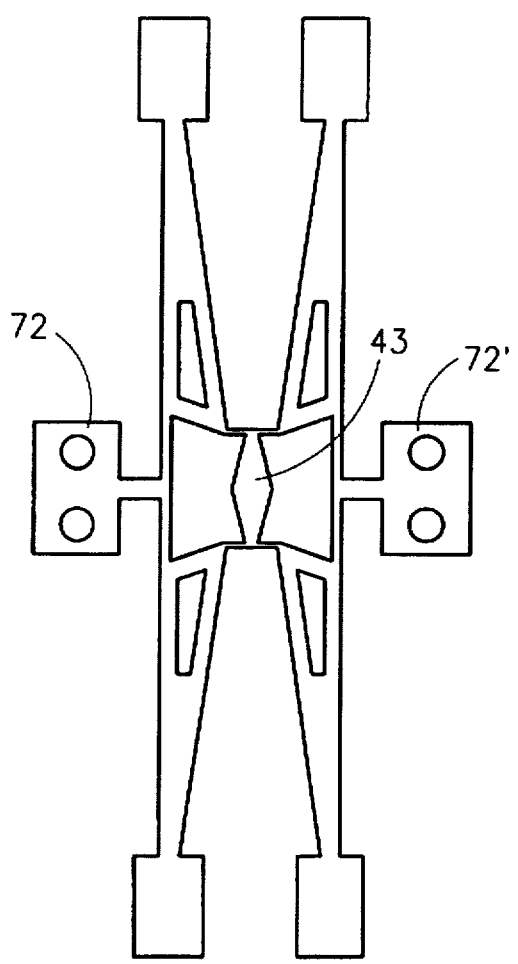
FIG. 13 illustrates a centrally excited H-type tuning fork according to the present invention.

FIG. 13 illustrates the application of the above excitation concept to the double-ended H-type tunning fork of FIG. 6, where the excitation is applied differentially between the two individual tuning forks by means of member 43'. 72 and 72' indicate two mounting bases.

Figure 14:
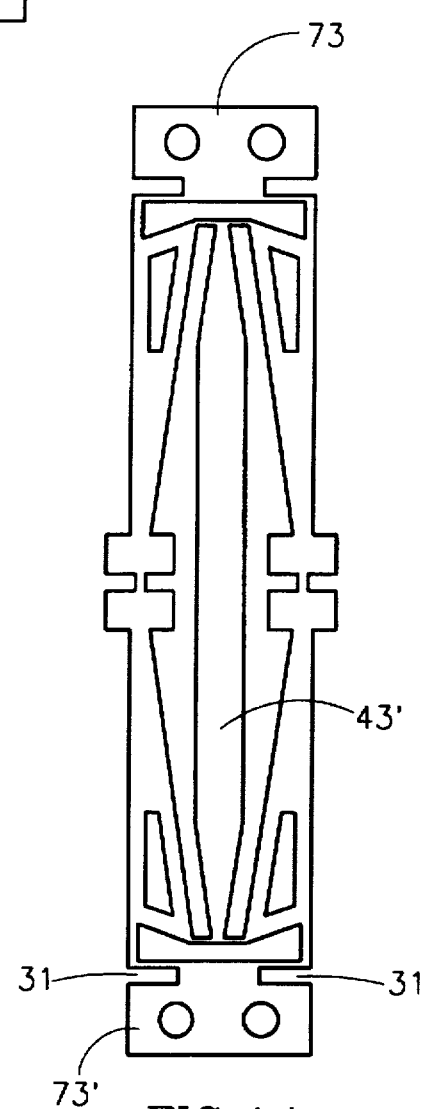
FIG. 14 illustrates a centrally excited frame-type symmetrical resonator according to the present invention.

FIG. 14 illustrates the application of the above excitation method to the frame-type resonator of FIG. 7, where the excitation is applied differentially between the two individual tuning forks by means of member 43. 73 and 73' indicate two mounting bases. In a similar manner the excitation can be applied to the configurations in FIGS. 8 and 9.

Until now the discussion was limited to single-axis rate sensors where Coriolis forces are the result of inertial rotation around a single sensitive axis which is parallel to the axis of symmetry of each of the structures. A typical application of single-axis rate-sensors is automotive vehicle yaw-sensors for skid sensing.

Figure 15:
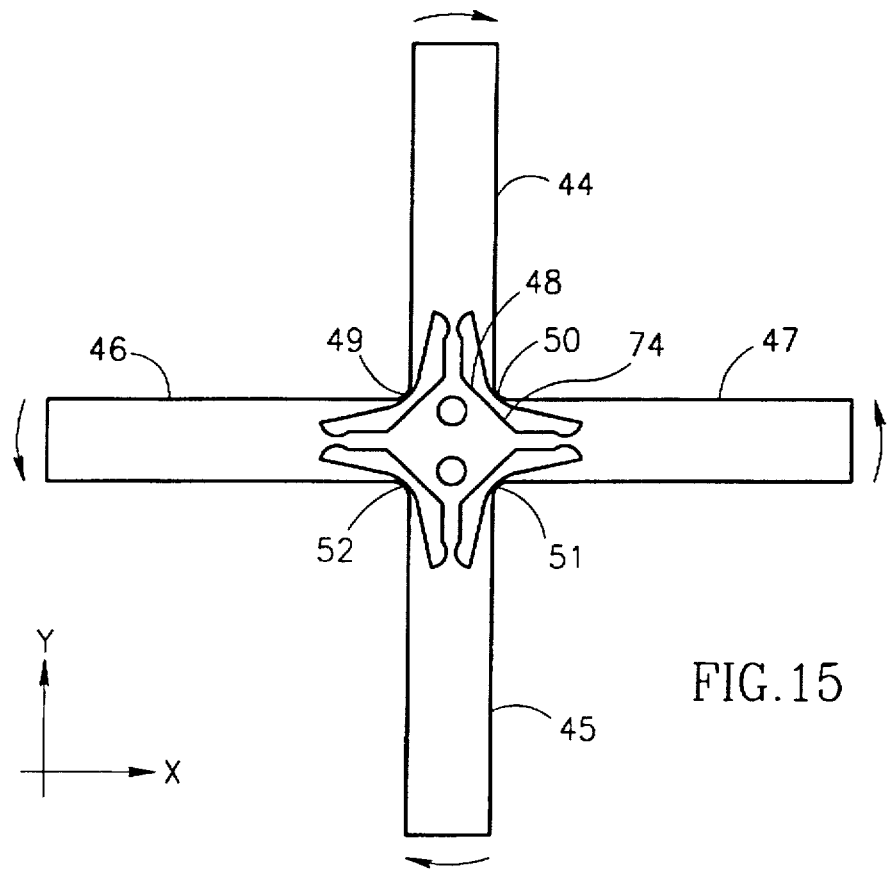
FIG. 15 illustrates a 2-axis rate-sensor according to the present invention.

In many applications, e.g. optical line-of-sight stabilization, two-axis inertial rate measurement is necessary. Therefore, if the advantages of vibratory rate sensors are desired, two single axis sensors would be used, alternatively, a single two-axis rate sensor would be advantageous in such applications. FIG. 15 illustrates a two-axis vibratory rate-sensor according to the present invention, including four vibrating tines 44, 45, 46, and 47 and a mounting base 74. The arrows indicate the polarity of the motion at a specific instant. As long as the four excitation amplitudes are equal, the total net angular momentum of the sensor is zero, and the structure is similar to two center-mounted beams that move in a scissors-like motion. The zero total angular momentum ensures no angular vibratory interaction with the mounting base 48 around an axis perpendicular to the plane of the paper.

When the two-axes sensor in FIG. 15 experiences inertial rate around the x-axis, i.e. around tines 46, 47—or around the y-axis parallel to tines 44 and 45, Coriolis accelerations will induce the tines to vibrate perpendicular to the plane of the paper and in opposite phase. The amplitude of the Coriolis accelerations will be equal if the excitation amplitude of the tines were equal. In that case, subtracting Coriolis induced deflections will provide an inertial angular rate signal that is insensitive to extraneous linear vibrations of the mounting base along the axis perpendicular to the plane of the paper, that might otherwise interfere with the output signal. This is so, since the extraneous accelerations act similarly on the two tines and their effect will thus be nullified by the subtraction. It is thus obvious that the amplitude of the excitation should be equal in the four tines. In order to ensure that the amplitude of the four tines is equal in spite of practical imperfections, as described above, the four tines are linked with mechanical couplings 49, 50, 51, and 52, that evenly distribute the excitation forces and equalize the arms' deflection.

Figure 16:
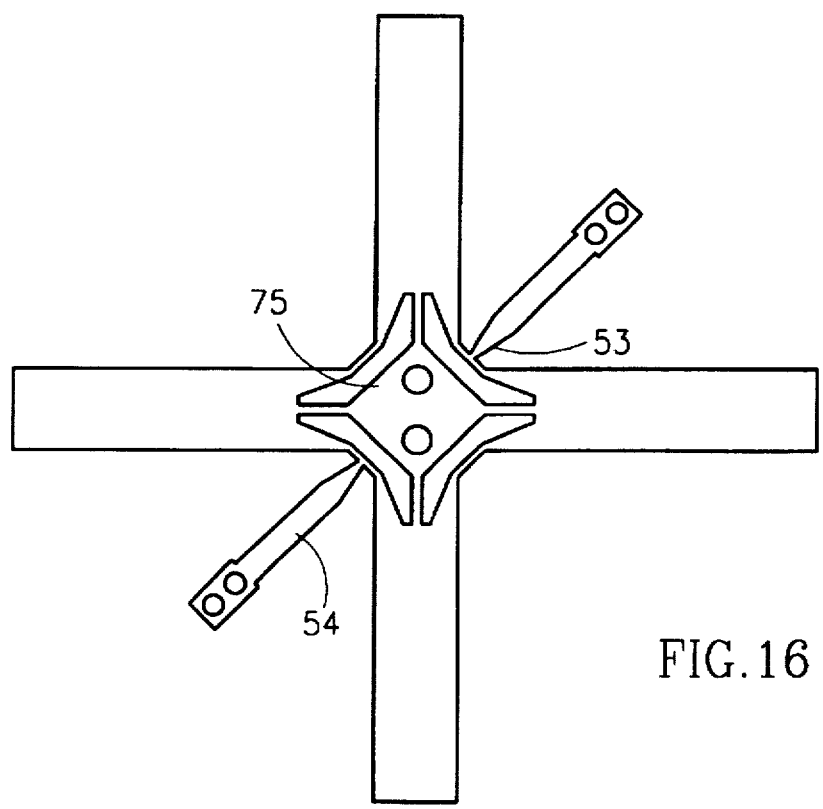
FIG. 16 illustrates a modified 2-axis rate-sensor according to the present invention.

FIG. 16 illustrates a modified two-axis angular rate sensor, according to the present invention, provided with a mounting base 75, wherein the tines are indirectly excited by means of elements 53 and 54, in a manner similar to that illustrated in FIG. 12. The operation of this embodiment is self-explanatory, but it should be emphasized that, depending on the specific design, four such excitation elements may be used.

While preferred embodiments of the invention have been described, it should be understood that the invention may be carried out with many modifications, variations and adaptations by persons skilled in the art, without departing from its spirit or exceeding the scope of its claims.

What is claimed is:

1. An inertial angular rate sensor (IARS), including a symmetrical planar mechanical resonator, comprising at least one pair of vibrating masses and including mechanical coupling means that force the masses to move in a symmetrical manner in the plane of the resonator despite mechanical tolerances.

2. An IARS including a tuning fork resonator with said mechanical coupling means as in claim 1.

3. An IARS including a frame-type resonator with said mechanical coupling means as in claim 1.

4. An IARS including an H-type tuning fork, wherein said vibrating masses are tines, said tuning fork including two pairs of said tines, the tines of each pair being coupled by said mechanical coupling means as in claim 1, and a plurality of stems allowing torsional motion of the tuning fork around a line of symmetry.

5. An IARS including a frame-type resonator, comprising two tuning forks according to claim 1, with respective tines connected.

6. An IARS including a frame-type resonator, wherein said at least one pair of vibrating masses are supported by parallel-motion bar mechanisms and coupled on either side by said mechanical coupling means, as in claim 1.

7. An IARS including a symmetrical mechanical resonator, according to claim 1, comprising means for exciting the vibrating masses by applying at least one force to the mechanical coupling means.

8. An IARS including a planar symmetrical mechanical resonator as in claim 7, wherein the force is applied by parametrically modulating the effective length of a mechanical member.

9. A two-axis IARS including a planar mechanical resonator as in claim 1, comprising four arms assembled in a cruciform shape and means for vibrating said arms in a scissors mode, wherein each pair of adjacent arms are coupled to move in said symmetrical manner in the plane of the resonator.

10. A two-axis IARS including a planar mechanical resonator as in claim 9, wherein the arms are indirectly excited by a force applied in the plane of the resonator along at least one axis of symmetry.

11. A two-axis IARS including a mechanical resonator as in claim 10, wherein said force is generated by parametrically modulating the effective length of a mechanical member.

* * * * *